(12) United States Patent
Rowe

(10) Patent No.: US 9,304,347 B2
(45) Date of Patent: Apr. 5, 2016

(54) TOUCH PANEL ASSEMBLIES AND METHODS OF MANUFACTURE

(71) Applicant: Amazon Technologies, Inc., Reno, NV (US)

(72) Inventor: Gabriel Isaiah Rowe, Fremont, CA (US)

(73) Assignee: Amazon Technologies, Inc., Reno, NV (US)

( * ) Notice: Subject to any disclaimer, the term of this patent is extended or adjusted under 35 U.S.C. 154(b) by 400 days.

(21) Appl. No.: 13/720,700

(22) Filed: Dec. 19, 2012

(65) Prior Publication Data
US 2013/0235285 A1  Sep. 12, 2013

Related U.S. Application Data

(60) Provisional application No. 61/603,547, filed on Feb. 27, 2012.

(51) Int. Cl.
| | |
|---|---|
| *G02F 1/13* | (2006.01) |
| *G02F 1/1335* | (2006.01) |
| *G02F 1/1333* | (2006.01) |

(Continued)

(52) U.S. Cl.
CPC ...... *G02F 1/13338* (2013.01); *G02F 1/133351* (2013.01); *G06F 3/044* (2013.01); *H01L 33/58* (2013.01); *G02F 1/133514* (2013.01); *G02F 2001/133331* (2013.01)

(58) Field of Classification Search
CPC ........................................................ H01L 33/58
USPC ............................................................. 349/12
See application file for complete search history.

(56) References Cited

U.S. PATENT DOCUMENTS

| | | | |
|---|---|---|---|
| 7,480,016 B2 | 1/2009 | Hinata | |
| 8,456,444 B2 | 6/2013 | Ishizaki et al. | |
| 9,119,305 B2 | 8/2015 | Takahashi et al. | |

(Continued)

FOREIGN PATENT DOCUMENTS

| | | |
|---|---|---|
| JP | 2010-146419 A | 7/2010 |
| JP | 2010-231186 A | 10/2010 |

(Continued)

OTHER PUBLICATIONS

International Search Report and Written Opinion issued in corresponding International Application No. PCT/US2013/024894 dated Apr. 16, 2013 (8 pages).

(Continued)

*Primary Examiner* — Wen-Ying P Chen
(74) *Attorney, Agent, or Firm* — Seyfarth Shaw LLP; Ilan N. Barzilay; Vamsi K. Kakarla

(57) ABSTRACT

A two layer touch panel structure utilizes direct-bonded touch panel and liquid crystal display (LCD) stackups for devices like tablets and computers. The top surface of a color filter and a receive conducting layer are placed close to the surface of the stackup. Placing a layer of conductive material on top of the color filter, on top of the polarizer, or on the cover glass can enable the process to be greatly simplified and cheaper than conventional processes, while maintaining excellent electrical and touch performance, and reducing ITO pattern visibility. Such a process also can utilize a large color filter, enabling significantly more pieces to be formed from a single stack and thus further improving efficiency and cost.

19 Claims, 7 Drawing Sheets

(51) Int. Cl.
*H01L 33/58* (2010.01)
*G06F 3/044* (2006.01)

(56) References Cited

U.S. PATENT DOCUMENTS

| | | |
|---|---|---|
| 2004/0114086 A1 | 6/2004 | Lee et al. |
| 2007/0001588 A1 | 1/2007 | Boroson et al. |
| 2007/0165181 A1* | 7/2007 | Kim et al. ............. 349/187 |
| 2009/0201242 A1 | 8/2009 | Govil |
| 2010/0181869 A1 | 7/2010 | Da Cunha et al. |
| 2010/0225612 A1* | 9/2010 | Ishizaki et al. ............. 345/174 |
| 2011/0210939 A1 | 9/2011 | Reynolds et al. |
| 2011/0234519 A1* | 9/2011 | Chan ............. 345/173 |
| 2014/0285737 A1 | 9/2014 | Takahashi et al. |

FOREIGN PATENT DOCUMENTS

| | | |
|---|---|---|
| JP | 4862969 B1 | 1/2012 |
| WO | 2007/146779 A2 | 12/2007 |

OTHER PUBLICATIONS

European Search Report of EP13755849.0 dated Oct. 20, 2015.
Office Action from Japanese Patent Application No. 2014-559902 (with English translation).

* cited by examiner

TOUCH PANEL ASSEMBLIES AND METHODS OF MANUFACTURE

CROSS-REFERENCE TO RELATED APPLICATIONS

This application claims priority to U.S. Provisional Patent Application No. 61/603,547, filed Feb. 27, 2012, entitles "Hybrid On-Cell Touch Panel," which is hereby incorporated herein in its entirety for all purposes.

BACKGROUND

People are increasingly utilizing a variety of computing devices, including portable devices such as tablet computers and smart phones. These devices typically often include touch-sensitive displays, enabling a user to provide input to a device through contact with a touch panel of a display screen. Conventional touch panel designs and manufacturing processes are complex and expensive. The complexity, along with factors such as small defects that result in faults on larger panels and the desire for high-resistance transparent conductor layers, also makes it difficult to scale to larger sizes. Further, the "transparent" conductor pattern often becomes visible as resistance of the panels is reduced to improve loading characteristics. Improved designs and manufacturing processes are thus desirable for at least these reasons.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure may overcome one or more of the aforementioned and other deficiencies experienced in conventional approaches to creating a touch panel assembly for use with an electronic device. In particular, various embodiments produce a layered touch panel structure that can provide for improved scalability over conventional touch panel designs. In at least some embodiments, a transparent conductor layer can be placed directly on an existing element of the layered structure, such as a color filter, polarizer, or cover glass layer, instead of an additional glass sheet as in conventional approaches. Such an approach can help to reduce the cost of manufacture, as well as to maintain excellent electrical and touch performance while reducing conductor pattern visibility.

Various other applications, processes and uses are presented below with respect to the various embodiments.

Figure 1:
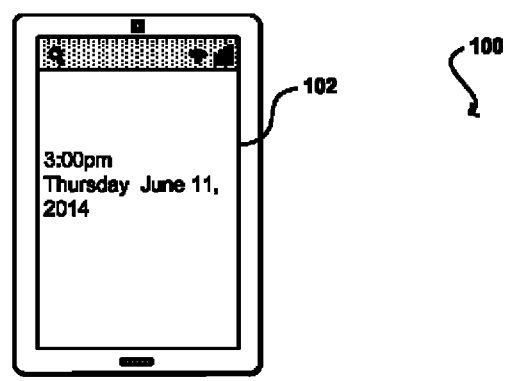
FIG. 1 illustrates an example of a computing device that can include a touch panel in accordance with various embodiments.

FIG. 1 illustrates an example of a touch panel display screen 102 that can be utilized with a computing device 100 in accordance with various embodiments. As known for such configurations, a user can interact with the device by bringing a finger or other object into contact with, or at least proximity to, the touch screen 102 such that the touch screen can not only detect the contact but also the location of one or more contacts in order to determine the input to the computing device. As mentioned, conventional approaches to manufacturing such touch panels have various deficiencies. Approaches in accordance with various embodiments discussed and suggested herein, however, utilize a different type of structure for a two layer projected capacitive touch panel assembly. At least one embodiment utilizes direct bonded touch panel and liquid crystal display (LCD) stackups for devices such as tablets, smart phones, and computers. Such a structure can be used for any size touch panel, but can be particularly advantageous for a larger form factor, such as those for above five inches diagonal in display size. A conventional glass-glass touch panel design uses a cover glass made from chemically strengthened glass, an optically clear adhesive (OCA), and another piece of glass that functions as the sensor glass. Embodiments discussed herein do not require two such pieces of glass, but rather utilize the top surface of the color filter (or other layer) of the display, as well as another conducting layer placed closer to the surface of the stackup. Indium Tin Oxide (ITO) is an example of a transparent conductor material that can be used to make sensor patterns due to its high transparency, low color shift, high conductivity, and ease of patterning. By placing a conductor such as an ITO layer on a layer such as the color filter, polarizer, or cover glass, for example, a process for creating a touch panel can be greatly simplified. Cost of manufacture can also be reduced dramatically while maintaining excellent electrical and touch performance, as well as reducing ITO pattern visibility. Another significant benefit to such a technique is that one layer can be processed on a large color filter. The generation size of the glass can be much larger than are currently produced by many touch panel vendors. Accordingly, the number of cuts per mother glass might be one the order of about 240 in the case of a large 2.2 meter by 2.5 meter glass, as opposed to only about 24 for a 0.6 by 0.8 meter glass size (a 10× improvement). The economy of scale of using the color filter for part of the touch panel design thus can be quite large, but the process is also greatly simplified.

The cost reduction in at least one embodiment, estimated to be approximately 50-75% compared to certain conventional designs, is due at least in part to a number of different factors.

For example, the combination of a high-yield sensor pattern on the color filter, the omission of metal traces on the color filter, direct bonding of a flexible printed circuit (FPC) to the ITO pattern on the color filter, and compatibility with the color filter and LCD process means that an LCD vendor, for example, can provide an additional ITO pattern on the color filter at low cost and low risk. It is anticipated that the yield from this sensor pattern will be near 100% as it is tremendously tolerant to defects (much more so than typical ITO sensor patterns at present). On the top ITO layer, this layer can be created in multiple ways, such as: 1) ITO film patterned and attached to the cover glass, 2) ITO pattern laser etched onto the cover glass surface, 3) ITO pattern deposited onto a piece of glass and attached to the cover glass by optically clear adhesive (OCA), 4) the ITO film or glass could be attached to the top of the polarizer, and 5) the ITO could be directly deposited onto the surface of the polarizer. Other materials, which can be etched or deposited in a way that is not harmful to the polarizer (e.g., non-aqueous etching methods), could be used directly on the surface of the polarizer film within the scope of the various embodiments. This top sensor pattern can utilize ITO sensor pattern features that are highly tolerant to defects, for example, and the expected yield for this layer using a 50 um ITO film would be >95% (again much better than current structures).

The sensor glass for a simultaneous multipoint touchscreen can consist of an X-Y pattern that can be a contiguous surface of diamonds all on a single layer. These diamonds in certain conventional approaches are connected together using small ITO bridges that are prone to breakage during fabrication. The ITO bridges also are isolated from each other by a passivation material such as polyimide being approximately 1 µm in thickness. ITO is typically sputtered onto both sides of the sensor glass, with one layer forming a sensing layer and the other forming a shield from the LCD noise. This process to flip the sensor glass over and perform multiple passivation steps is time consuming, costly, and without careful process control is low yield.

Since the X and Y layers of various embodiments discussed herein are on different layers, the use of narrow bridges and passivation layers is not required. Furthermore, the use of different layers allows careful tuning of the structure for specific advantages. The lower layer, which functions as a set of transmit electrodes, can be used to shield noise from the LCD. The upper electrodes, acting as receive electrodes, can be tuned to minimize the capacitive coupling to water drops on the device and minimize common mode noise, while being optimized to maximize finger touch signal.

Structures in accordance with various embodiments can also improve the user's ability to see the display without the negative case of visualization of an ITO pattern because of the placement of one of the ITO layers "below" the polarizer (with respect to the exposed surface of the display). Also, since the ITO can be deposited before the color filter process, the ITO can be processed at a high temperature and annealed at a high temperature and results in an ITO layer that will cause minimal color shift compared to most ITO sensors currently used. On many devices at the seven inch size and above, the ITO pattern is quite visible in bright lighting conditions such as outdoors or beneath bright indoor lighting. A fabrication process to build such a sensor stackup as discussed herein is unique in that can reduce the number of process steps, utilize automated visual inspection rather than electrical testing, and utilize reduced complexity parts to maximize yield.

Figure 2A:
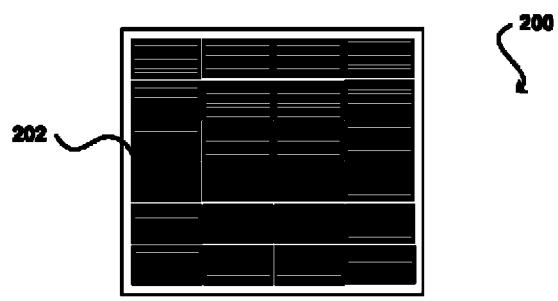
FIGS. 2(a), 2(b), 2(c), and 2(d) illustrate an example of an ITO pattern and associated results that can be obtained in accordance with various embodiments.
Figure 2B:
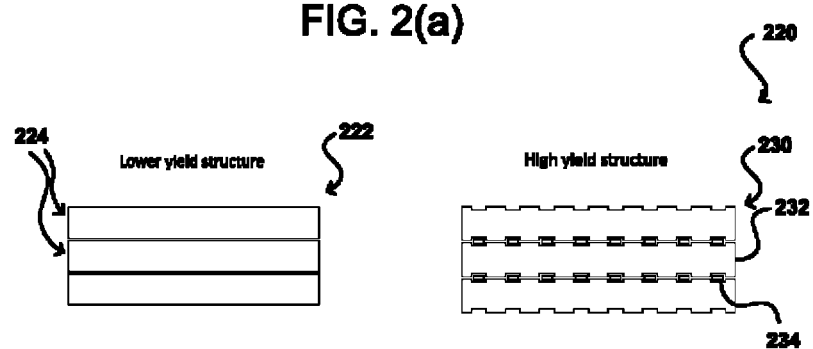
Figure 2C:
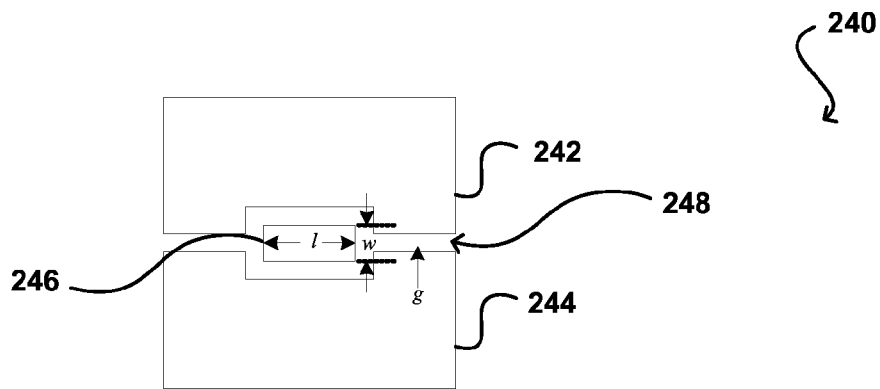

An example process for manufacturing such a touch panel component will be described with respect to FIGS. 2-9. Such a process involves obtaining an appropriate substrate 200, as illustrated in FIG. 2(a), such as an appropriately-sized piece of raw glass (e.g., a sheet on the order of 2-3 meters by 2-3 meters). The glass may be thinned as appropriate. A layer of conductive material, such as ITO, can be deposited using a process such as conventional ITO sputtering or evaporation. The ITO layer can be deposited to have any appropriate resistance, such as a sheet resistance of around 200 ohms per square. The ITO then can be etched to create a desired pattern 202. FIG. 2(b) illustrates a relatively low-yield pattern 222 containing an array of conductive strips 224 of ITO. The piece of glass in this example is on the order of 2 meters by 2 meters. The width of each strip is about 5 mm, with the length of each strip being on the order of the length (or width) of an LCD active area. The space between the electrodes in the pattern can be between about 10 microns and about 50 microns, such as on the order of about 30 microns in one example. By utilizing a specific pattern for the conducting electrodes on the color filter, the yield of such a structure can be significantly improved. For example, FIG. 2(c) illustrates an example structure 230 of an improved yield form, which includes an array of long, shaped strips 232 with an array of interspersed, floating electrode elements 234 formed from the same conductive layer. For example, the pattern can be etched into a deposited layer of ITO. Such a pattern may be utilized to ensure the yield is close to 100% to ensure economical production. The need for a very high yield structure in at least some embodiments is due at least in part to the fact that the color filter is attached to the LCD thin film transistor (TFT) glass in the mother glass form, and functional high-cost LCD TFT substrates may be attached to defective color filter parts.

FIG. 2(c) illustrates an exploded view 240 of a portion of the conductive pattern 230 illustrated in FIG. 2(b). In this example a portion of a first long electrode strip 242 and a portion of a second long electrode strip 244 separated by a space 248 running between the electrode strips, where the space has a width g, which as discussed can be on the order of tens of microns in at least some embodiments. The electrode strips 242, 244 can be referred to as transmit electrodes. Between the portions, and spaced at regular intervals in at least some embodiments, is a floating electrode element 246 that is not connected to any power source. As illustrated, the floating electrode has a length l and a width w, which also can be on the order of tens of microns in at least some embodiments. As the length of the floating electrode element is increased, however, the yield of the process can increase as discussed later herein.

Figure 2D:
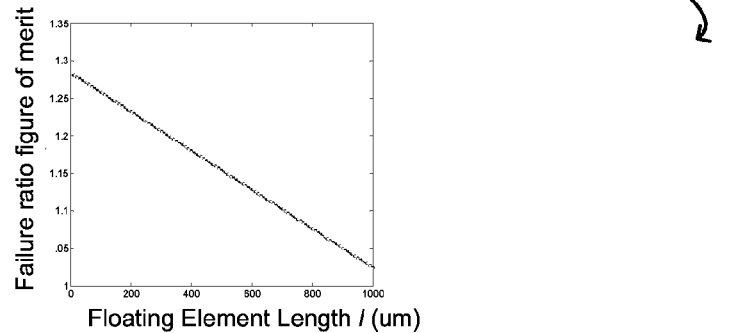

A combination of a driven transmit electrode and periodically spaced electrically floating electrodes can be formed using the same layer, and can be part of a two layer transmit and receive capacitive touch panel scheme that uses this first layer (having a driving layer with both driven and floating electrode elements), and the second layer placed on a different plane acting as the receiving layer. This receiving layer could be placed on another film that is optically bonded to the surface of the polarizer, an anti-reflective film, the surface of the cover glass above the lower electrode layer, the opposing side of a glass substrate, or on the opposing side of a PET film substrate or other substrate material suitable for lamination into a stackup, where the stackup can be transparent and function as a touch panel on the top surface of a device display. The effect of such a pattern on the yield is illustrated in the diagram 260 of FIG. 2(d). The critical dimensions varied in FIG. 2(d) show that as the segment/increases in length, the yield improves. This is due to the fact that the statistical likelihood of a defect resulting in a short between the two long and wide electrodes decreases as the length of the floating electrode element is increased.

Once the patterns are etched or otherwise formed in the ITO layer, short testing or other quality control analysis can be performed. Short testing at this stage can be relatively expensive in at least some settings, and can be at least somewhat difficult to build and operate. Alternatively, a visual inspection can be performed, based at least in part upon the well-defined ITO spacings, to determine whether there are any defects or shorts between the ITO strips. Such a visual inspection can be very fast and quite low cost, and can be nearly as accurate as an open short test. Visual inspection can be done with a light source or contrast agent to highlight the differences where ITO is present and has been removed. For example, a visual inspection process can utilize infrared (IR) or ultraviolet (UV) light and examine the reflections using an appropriate camera, sensor, sensor array, or other such component.

Figure 3:
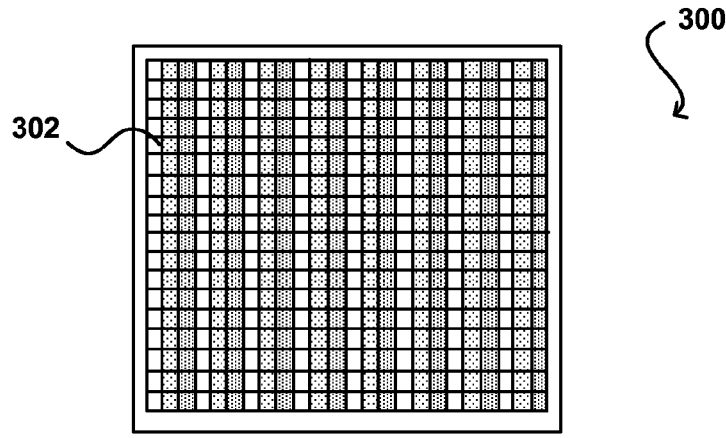
FIG. 3 illustrates an example color filter pattern that can be formed in accordance with various embodiments.
Figure 4:
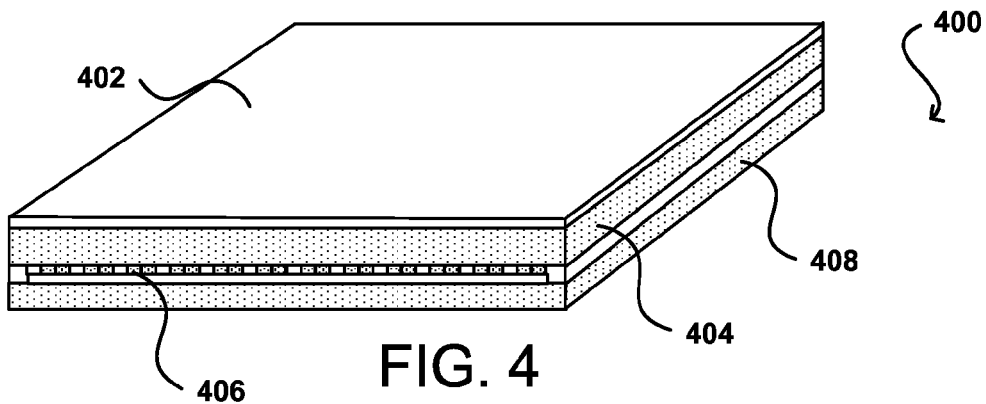
FIG. 4 illustrates an example of a touch panel component during manufacture in accordance with at least one embodiment.

With the ITO patterning performed on a first or "top" side of the glass, a conventional process can be used to create the color filter layer 302 on the other side of the glass, as illustrated in FIG. 3. It should be understood that use of terms such as "top," "front," and the like are used for purposes of convenience and explanation, and should not be construed as requiring specific orientations unless otherwise stated herein. A benefit of using large ITO features that do not have small gaps is that the features do not easily break or become damaged, such that the ITO does not need to be protected by some sort of photoresist layer or organic coating layer following the final inspection. The color filter process can be performed with respect to one side of the glass sheet, and extra care does not need to be taken to ensure that the machines used to do the processing for the color filter avoid damaging the backside ITO, which is extremely robust in its current form.

Before, during, or after the color filter process is completed, a TFT glass component can be created and/or otherwise obtained. The TFT glass can be created using any conventional process used or subsequently developed for such purposes. When completed, the TFT glass component 408 can be attached to the color filter component 404 as illustrated in the example stack 400 of FIG. 4. The color filter (CF) glass in this example is on the order of 0.5 mm thick, such that the raw thickness of the CF glass can be utilized without requiring a slimming process. The bottom surface (the TFT glass) can have been slimmed down to a thickness on the order of about 0.25 mm using a conventional slimming process, for example, thus resulting in an asymmetric LCD etching process. The CF and TFT components with the CF layer 406 in between can be attached using an adhesive that is drawn in a rectangular pattern and placed first on the TFT glass, for example. Liquid crystal material can be filled into the space between the two pieces of glass, with the two pieces of glass being pushed together or otherwise brought into contact such that the adhesive holds them together. The ITO pattern 402 can be on the top surface of the cover glass, such as is discussed with respect to FIG. 2(c). While the ITO layer can be formed before the TFT glass is added, for example, in some embodiments the ITO can be deposited after the TFT and CF glass elements have been connected. Such an approach can require a lower temperature deposition process, however, which might not provide the same level of optical performance as a higher temperature process in at least some embodiments. It should be understood that terms such as "top" and "bottom" are used for purposes of explanation and do not require specific orientations unless otherwise stated. In at least some embodiments, another glass thinning can be performed before the deposition of the ITO but after the TFT and CF layers have been connected.

Figure 5:
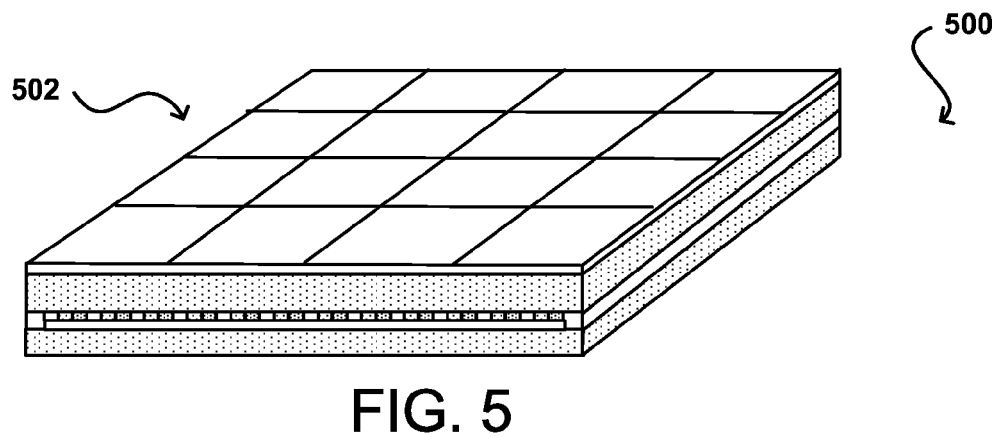
FIG. 5 illustrates an example of a touch panel component during manufacture in accordance with at least one embodiment.

As illustrated in the state 500 of FIG. 5, the bulk sheet can be segmented into individual cells 502 that are approximately the same size as the display (e.g., LCD) of the target device. For a 2.5 meter by 2.5 meter sheet, for example, the cells could be order of about 100 mm by 150 mm each. The segmenting or cutting process can be performed using a grinding wheel or glass cutting wheel, for example, where the surface is scribed and the glass is broken by bending the two surfaces. The top and bottom can both scribed in at least one example, as may be in two different locations due to the difference in size of the top and bottom glass sheets. A laser etching process with a break can also be used, as well as another such process.

Figure 6:
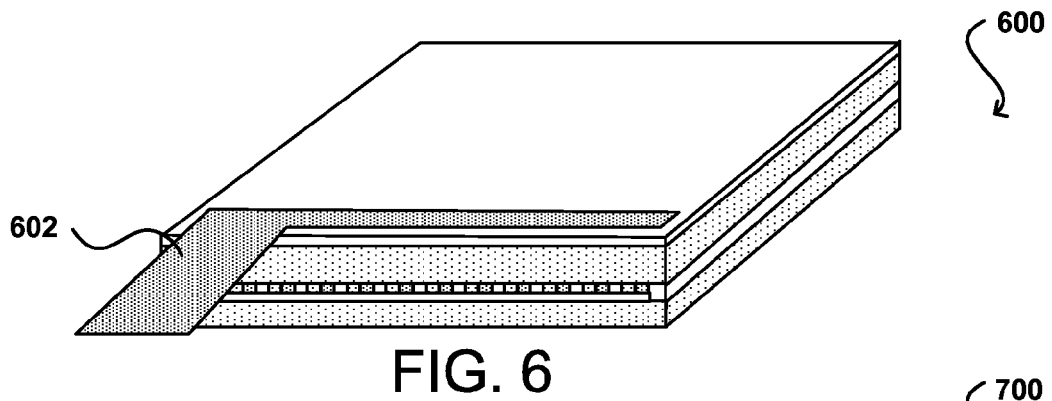
FIG. 6 illustrates an example of a touch panel component during manufacture in accordance with at least one embodiment.

The view 600 of FIG. 6 illustrates an individual cell or piece after the segmenting. A Flexible Printed Circuit (FPC) 602 or other appropriate connector can be attached to the cell, such as by being bonded directly to the ITO with no metal traces being needed, as in certain conventional devices. An Anisotropic Conductive Film (ACF) bond can be used in at least some embodiments, and the FPC can be attached at the same time that other FPC's are being attached to the TFT side in some embodiments, increasing efficiency of the overall process.

Figure 7:
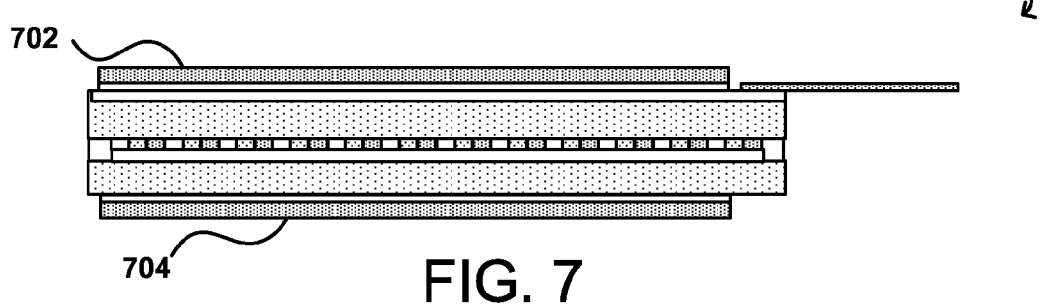
FIG. 7 illustrates an example of a touch panel component during manufacture in accordance with at least one embodiment.

As illustrated in the side view 700 of the stack in FIG. 7, a pair of polarizers 702, 704 can be attached after bonding the FPC. The polarizer layers can have any appropriate thickness, such as a thickness on the order of about 0.1 mm. Since is potential for heat transfer from the bonding head to transfer into the polarizer, and a polarizer can be damaged if heated above its operating temperature, it can be desirable to perform the FPC bonding an appropriate cooling before attaching the polarizing layers. The upper and lower polarizers 702, 704 are polarized (or positioned) to be 90 degrees out of phase with respect to each other, such that light from a backlight (not shown) that will be transmitted through the bottom surface will be almost completely attenuated unless the polarization is altered (during absorption and retransmission) by the liquid crystal layer when actuated. The net result is that light can be effectively turned on and off by the liquid crystals.

Figure 8:
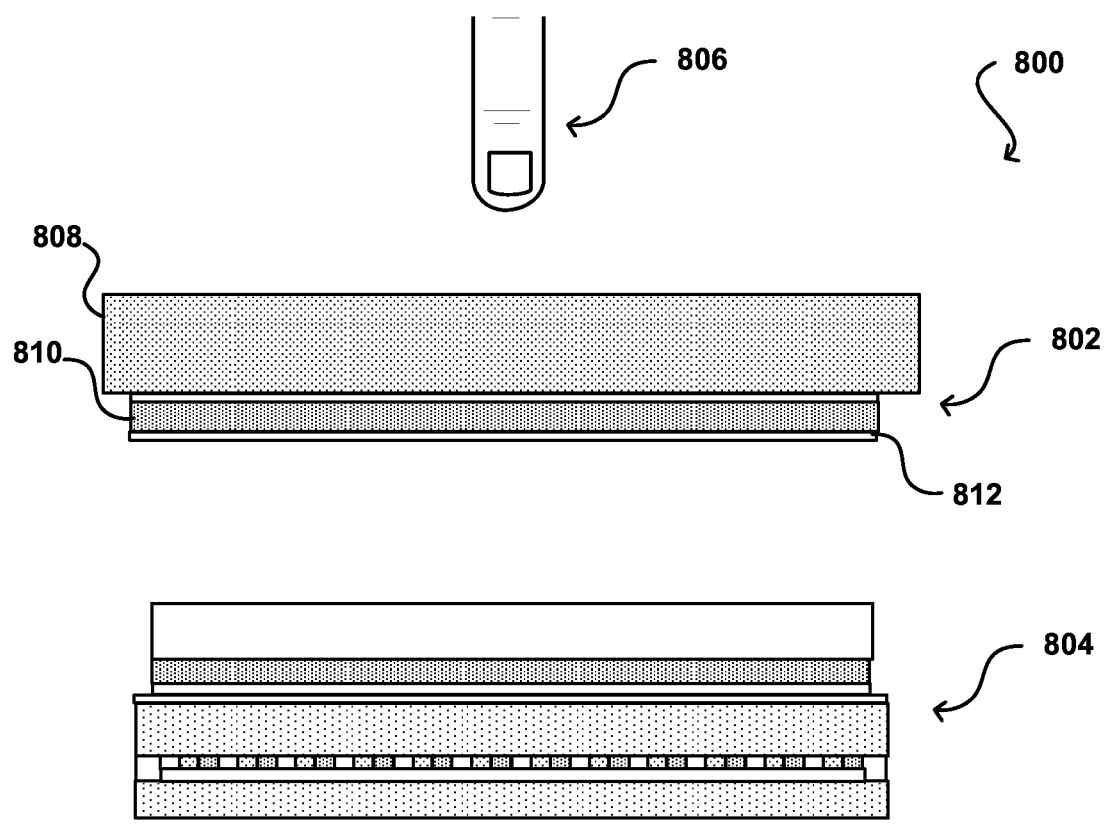
FIG. 8 illustrates an example of touch panel components during manufacture in accordance with at least one embodiment.
Figure 9:
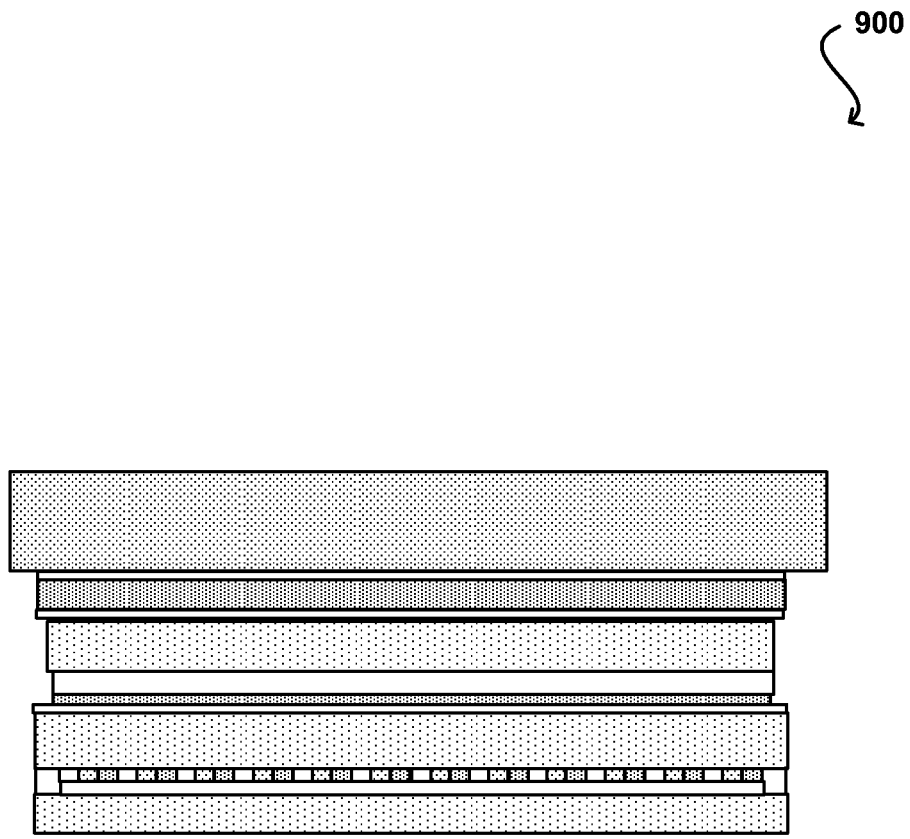
FIG. 9 illustrates an example of a touch panel assembly formed in accordance with at least one embodiment.

The layered structure 804 then can be combined with another portion of the touch panel 802 as illustrated in the example side view 800 of FIG. 8. The touch panel portion, comprising a cover glass 808 and ITO film 810 in this example, can be manufactured in a number of different ways. One such approach involves attaching an ITO layer that includes a PET (polyethylene terephthalate) or cyclo-olefin film that has a built in, optically clear piece of optically clear adhesive (OCA) 812 that can be attached directly to the cover glass surface. The cover glass can have a thickness on the order of about 0.5 mm-1.5 mm. The thickness of the ITO film with the ITO pattern can vary in thickness, such as from 20 microns up to 200 microns. The ITO layer can be configured to have a receive (RX) structure or second set of electrodes, which will be "above" the lower transmit (TX) electrode structure. The receive electrodes are not on the same layer as the color filter below, and are placed closer to where a user's finger 806 would contact. The ITO pattern could be a series of narrow strips with various electrically floating pieces of ITO between the strips as discussed previously. The pattern also could comprise be a layer of ITO electrodes that form a variety of different patterns that could be a combination of strips and diamonds, or a series of multiple strips electrically tied together. The space between the ITO active areas could be completely etched away in some embodiments, or partially etched so there are floating pieces of ITO left over. In any case, the ITO layer is placed above the lower assembly, whether placed on an ITO film or directly on the cover glass, for example. In some embodiments a black mask could be positioned on the surface of the cover glass, which is typically done to mask out the areas around the LCD active area. The ITO could be deposited on the black mask and then the areas between the ITO features etched away to form the pattern. Such a process can result in a very thin stack. FIG. 9 shows a view 900 of the final assembly, with the portions combined and the ITO positioned above the color filter pattern. An ITO film could actually be attached to the polarizer as well in some embodiments, as there is no need for it to actually be attached to the cover glass.

In another embodiment, the ITO and polarizer can be combined into one material. The ITO could be directly deposited onto the top surface of the polarizer, and then patterned in a way that can be different than the way ITO is typically patterned. The patterning could be performed using a dry etch process (e.g., reactive ion etching), as opposed to a wet etch process. The use of a dry etch avoids damaging the PVA (polyvinyl acetate) structure of the polarizer. Laser ablation of the ITO could also be used when the ITO is formed on the cover glass. Another possible method would be to use a piece of glass that has the ITO pattern on one surface.

In a later step, the entire assembly can be laminated together. A full lamination process can prevent an air gap, which can otherwise make the device sensitive to air, moisture, and pressure, for example, which can make the device virtually un-usable. Thus, this type of implementation might require full lamination.

Such processes can provide a structure for a touch panel that leverages various manufacturing processes that are likely to scale effectively in the future. One process that is interesting but difficult to do involves a dual layer structure ITO pattern (on a top and a bottom of a piece of glass). Structures discussed herein utilize a unique process, however, that is simpler and cheaper than conventional approaches, and leverages scalable manufacturing processes. Such a process utilizes very large pattern features of the ITO compared to the size of dust particles, defects, and contaminants that could typically cause a short or open on the surface of the ITO, thus having the likelihood for high yield. This is important because if the yield is not high for large color glass then there will be very limited choice when attaching the cover glass to the backside TFT/LCD glass as to which of the color filters to be attached. All of the pieces generally will have to be attached at one time. If there are a number of defective pieces, those pieces actually come with that color filter and ruin the bottom LCD. Also, a conventional single layer conventional process requires four masking steps (resulting in a lower yield), and processes discussed herein utilize only one such step. The ITO is patterned first, then instead of using a passivation layer or metal layer there is no further processing. Instead the ITO is bonded directly to the FPC with metal traces to connect out to the sensing circuit. Such a process is relatively easy to perform as well. Such a process produces a "driving layer" that will not interfere with an LCD or similar component.

Figure 10:
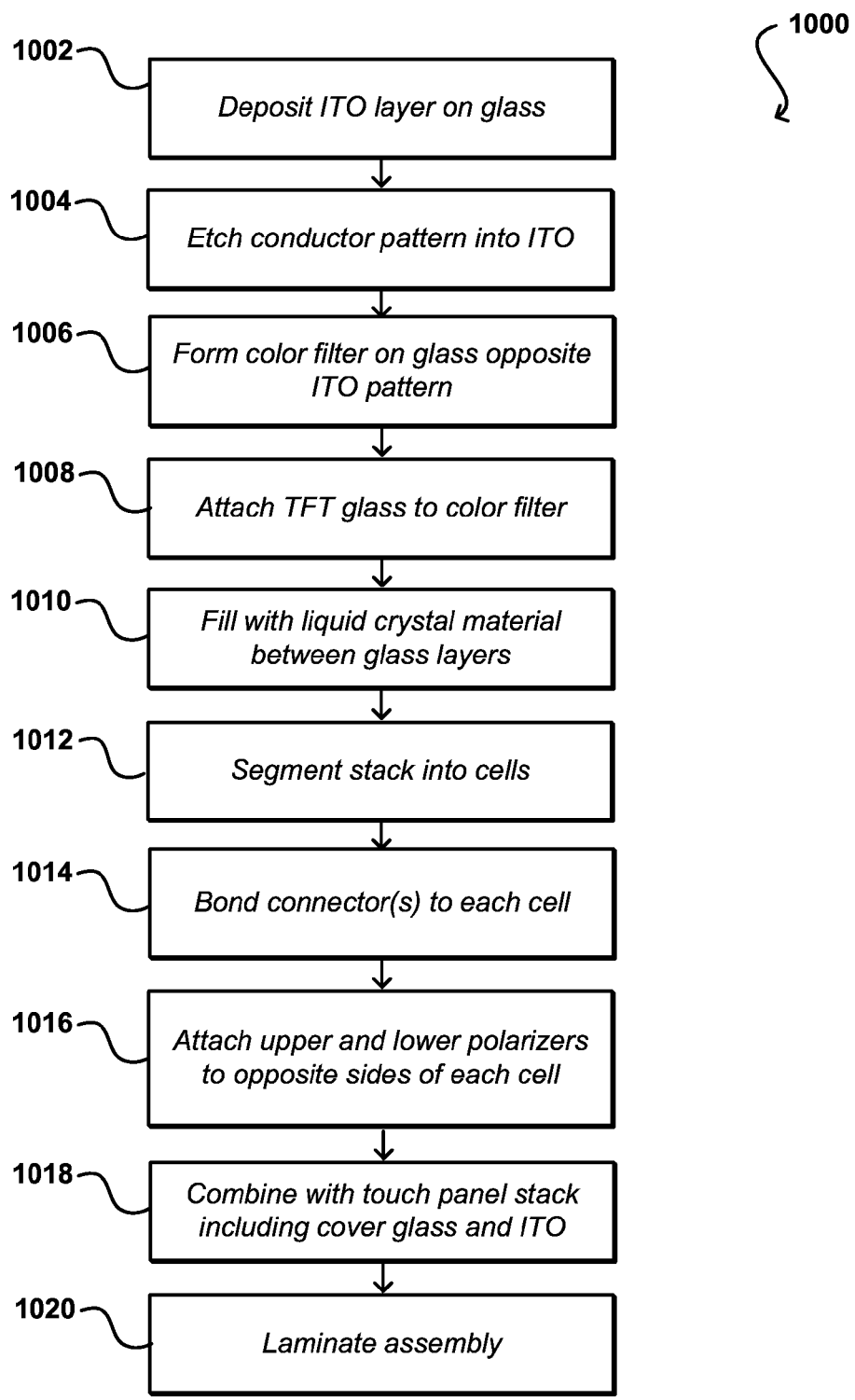
FIG. 10 illustrates an example process for manufacturing a touch panel that can be utilized in accordance with various embodiments.

FIG. 10 illustrates an example process 1000 for manufacturing a touch panel assembly that can be utilized in accordance with various embodiments. It should be understood that, for this and other processes discussed herein, there can be additional, fewer, or alternative steps performed in similar or alternative orders, or in parallel, within the scope of the various embodiments unless otherwise stated. In this example a layer of conductive material, such as ITO, is deposited 1002 on a sheet of glass. An appropriate pattern can be etched 1004 or otherwise formed into the ITO layer, such as to form a plurality of sets of conductive strips each designed for use with a respective touch display. A color filter can be formed 1006 on the glass, using a surface opposite that of the conductive ITO pattern layer. A TFT glass or similar layer then can be attached 1008 to the color filter layer. A liquid crystal material can be used to fill 1010 the space in between the glass layers of the stack. Once the stack is formed, the stack can be segmented 1012 into a set of individual cells. As discussed, the cells can be of any appropriate size, such as approximately the size of a display screen of a target computing device. One or more connectors then can be bonded 1014 or otherwise connected to each cell using an appropriate bonding technique. An upper polarizer and a lower polarizer can be attached 1016 to opposite surfaces of each cell, with the polarizers being ninety degrees out of phase in at least some embodiments. Each cell then can be combined 1018 with a touch panel stack, including at least a cover glass layer with an ITO conductor pattern. The final cell stacks can each be laminated 1020 and prepared for installation in an appropriate electronic device.

Figure 11:
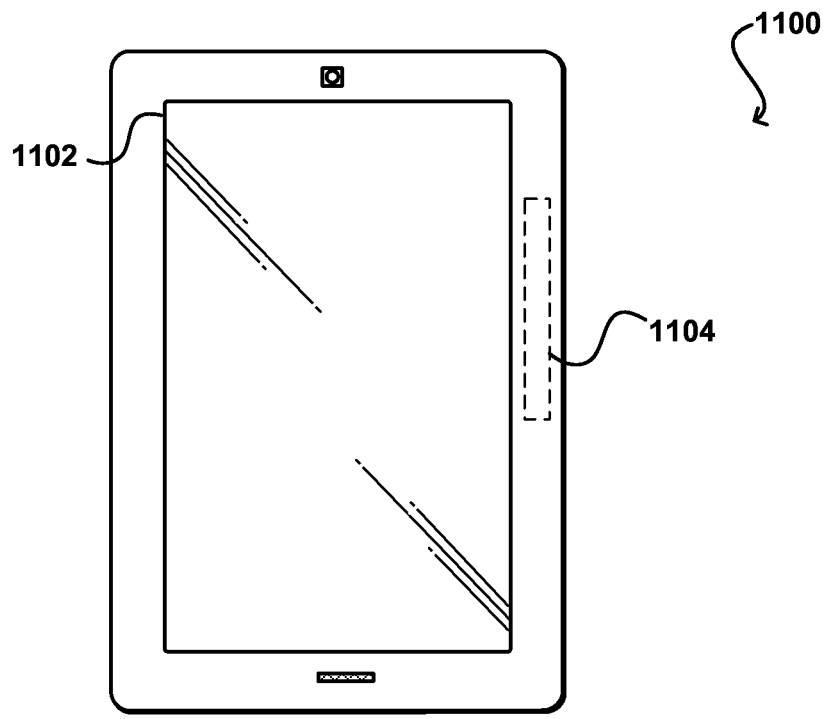
FIG. 11 illustrates an example device capable of including a touch panel in accordance with various embodiments.

FIG. 11 illustrates an example electronic user device 1100 that can be used in accordance with various embodiments. Although a portable computing device (e.g., an electronic book reader or tablet computer) is shown, it should be understood that any electronic device capable of receiving, determining, and/or processing input can be used in accordance with various embodiments discussed herein, where the devices can include, for example, desktop computers, notebook computers, personal data assistants, smart phones, video gaming consoles, television set top boxes, and portable media players. In this example, the computing device 1100 has a display screen 1102 on the front side, which under normal operation will display information to a user facing the display screen (e.g., on the same side of the computing device as the display screen). It should be understood that computing devices such as servers, however, may not have dedicated display elements. The example computing device 1100 also includes at least one networking component 1104, such as a network interface card, wireless networking component, and the like, enabling the computing device to communicate information over at least one network.

Figure 12:
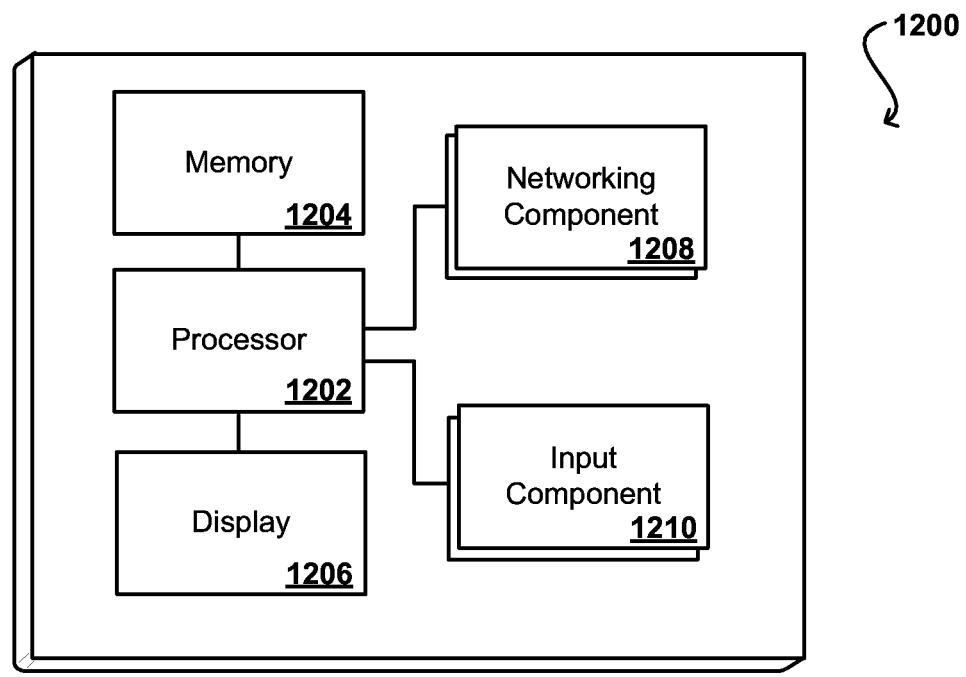
FIG. 12 illustrates a set of components of an example device that can be utilized in accordance with various embodiments.

FIG. 12 illustrates a logical arrangement of a set of general components of an example computing device 1200 such as the device 1100 described with respect to FIG. 11. In this example, the device includes a processor 1202 for executing instructions that can be stored in a memory device or element 1204. As would be apparent to one of ordinary skill in the art, the device can include many types of memory, data storage, or non-transitory computer-readable storage media, such as a first data storage for program instructions for execution by the processor 1202, a separate storage for images or data, a removable memory for sharing information with other devices, etc. The device typically will include some type of display element 1206, such as a touch screen or liquid crystal display (LCD), although devices such as portable media players might convey information via other means, such as through audio speakers. In some embodiments, the computing device 1200 of FIG. 12 can include one or more networking and/or communication elements 1208, such as a Wi-Fi, Bluetooth, RF, wired, or wireless communication system. The device in many embodiments can communicate with a network, such as the Internet, and may be able to communicate with other such devices. In some embodiments the device can include at least one additional input component 1210 able to receive conventional input from a user. This conventional input can include, for example, a push button, touch pad, touch screen, wheel, joystick, keyboard, mouse, keypad, or any other such device or element whereby a user can input a command to the device. In some embodiments, however, such a device might not include any buttons at all, and might be controlled only through a combination of visual and audio commands, such that a user can control the device without having to be in contact with the device.

As discussed, different approaches can be implemented in various environments in accordance with the described embodiments. As will be appreciated, although a Web-based environment is used for purposes of explanation in various examples, different environments may be used, as appropriate, to implement various embodiments. Such a system can include an electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks an alternative device serving a similar purpose could be used, as would be apparent to one of ordinary skill in the art.

An illustrative environment includes at least one application server and a data store. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

Each server typically will include an operating system that provides executable program instructions for the general administration and operation of that server and typically will include non-transitory computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are discussed. Thus, the depiction of the system should be taken as being illustrative in nature and not limiting to the scope of the disclosure.

As discussed above, the various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of forming a touch panel assembly, comprising:
    depositing a layer of conductive material on a first surface of a glass sheet;
    patterning the conductive material into a first set of electrodes;
    forming a color filter layer on a second surface of the glass sheet, the second surface being opposite the first surface;
    forming a thin film transistor (TFT) display layer;
    connecting the thin film transistor (TFT) display layer to the color filter layer using an adhesive to form an intermediate stack;
    injecting a layer of liquid crystal material into space between the TFT display layer and the color filter layer in the intermediate stack;
    cutting a pattern into the intermediate stack in order to segment the intermediate stack into a plurality of cells;
    bonding at least one electrical connector to the intermediate stack;
    connecting a first polarizer to an upper surface of the intermediate stack and a second polarizer to a lower surface of the intermediate stack, the first polarizer having a first polarization oriented at approximately ninety degrees with respect to a second polarization of the second polarizer; and
    connecting a top stack to the first polarizer to form a final stack, the top stack including at least a cover glass sheet and an upper patterned conductive layer, the upper patterned conductive layer forming a second set of electrodes.

2. The method of claim 1, further comprising:
    laminating the final stack.

3. The method of claim 1, further comprising:
    forming a floating electrode element between two electrodes of the first set of electrodes in the layer of conductive material, the floating electrode element being electrically isolated from the two electrodes.

4. The method of claim 1, wherein the depositing of the layer of conductive material on the first surface of the glass sheet is performed one of before or after forming the color filter layer on the second surface of the glass sheet.

5. A method of forming a touch panel assembly, comprising:
    forming a pattern of electrodes in a layer of conductive material deposited on a first surface of a glass sheet;
    forming a color filter layer on a second surface of the glass sheet, the second surface being opposite the first surface;
    connecting a thin film transistor (TFT) display layer to the color filter layer to create an intermediate stack;
    placing liquid crystal material between at least a portion of the TFT display layer and the color filter layer;
    cutting a pattern into the glass sheet with the color filter layer and the TFT display layer in order to segment the glass sheet into a plurality of individual cells;
    connecting at least one electrical connector to the intermediate stack;
    connecting a first polarizer to an upper surface of the intermediate stack and a second polarizer to a lower surface of the intermediate stack, the first polarizer having a first polarization oriented at approximately ninety degrees with respect to a second polarization of the second polarizer; and connecting a cover glass sheet to the connecting stack to form the touch panel assembly, the cover glass having formed thereon an upper patterned conductive layer forming a second set of electrodes.

6. The method of claim 5, further comprising:
laminating the touch panel assembly.

7. The method of claim 5, wherein connecting the at least one electrical connector to the intermediate stack includes connecting an electrical connector of the at least one electrical connector to one of the individual cells.

8. The method of claim 7, wherein each of the individual cells has a size corresponding to an associated type of display device.

9. The method of claim 5, wherein the pattern of electrodes includes a plurality of parallel strips formed into the layer of conductive material.

10. The method of claim 9, wherein the pattern of electrodes further includes a floating electrode element between a pair of the parallel strips.

11. The method of claim 10, further comprising:
adjusting a length to be used for the floating element, an increase in the length of the floating electrode reducing a likelihood of an electrical short between the pair of the parallel strips.

12. The method of claim 5, wherein the layer of conductive material comprises at least one of Indium Tin Oxide (ITO), Graphene, carbon nanotubes, or a metal mesh.

13. The method of claim 5, further comprising:
performing short testing on the pattern of electrodes before connecting at least the first polarizer.

14. A touch panel stack, comprising:
a cover glass layer;
a first polarizer positioned proximate a first surface of the cover glass layer;
a first set of electrodes formed on a second surface of the cover glass layer, the second surface being opposite the first surface;
a thin film transistor (TFT) display component;
a glass sheet positioned between the cover glass layer and the TFT display component, the glass sheet having a color filter layer formed thereon;
a liquid crystal layer between the glass sheet and the TFT display component;
a second polarizer proximate a first side of the TFT display component, the first side being opposite a second side of the TFT display component, the second side of the TFT display component being proximate the first polarizer;
a second set of electrodes positioned proximate at least one of the color filter layer, the glass sheet, or the second polarizer, wherein the second set of electrode is separated from the first set of electrodes; and
wherein at least one of the first set of electrodes or the second set of electrodes is patterned to include at least a pair of parallel strips separated by at least one floating electrode element, the at least one floating electrode element being electrically isolated from the pair of parallel strips.

15. The touch panel stack of claim 14, further comprising:
at least one connector for applying a voltage to at least one of the first set of electrodes or the second set of electrodes.

16. The touch panel stack of claim 14, further comprising:
at least one connector enabling control of a state of the liquid crystal layer, the state of the liquid crystal layer determining a transparency of the touch panel stack.

17. The touch panel stack of claim 14, wherein the touch panel stack is laminated.

18. The touch panel stack of claim 14, wherein at least one of the first set of electrodes or the second set of electrodes is formed from at least one of Indium Tin Oxide (ITO), Graphene, carbon nanotubes, or a metal mesh.

19. The touch panel stack of claim 14, wherein the first polarizer has a first polarization oriented at approximately ninety degrees with respect to a second polarization of the second polarizer.

* * * * *